United States Patent [19]
Millican et al.

[11] Patent Number: 5,886,362
[45] Date of Patent: Mar. 23, 1999

[54] METHOD OF REFLOWING SOLDER BUMPS AFTER PROBE TEST

[75] Inventors: Lavoie R. Millican, Chandler; Vern H. Winchell, II, Scottsdale, both of Ariz.

[73] Assignee: Motorola, Inc., Schaumburg, Ill.

[21] Appl. No.: 161,015

[22] Filed: Dec. 3, 1993

[51] Int. Cl.⁶ .................................................. H01L 23/58
[52] U.S. Cl. ................... 257/48; 438/14; 438/613
[58] Field of Search .......................... 257/48, 737, 738; 437/8, 183; 324/158 T; 438/14, 613

[56] References Cited

U.S. PATENT DOCUMENTS

| | | | |
|---|---|---|---|
| 4,273,859 | 6/1981 | Mones et al. | 437/183 |
| 4,814,283 | 3/1989 | Temple et al. | 437/8 |
| 5,002,895 | 3/1991 | LaParquier et al. | 437/8 |
| 5,289,631 | 3/1994 | Koopman et al. | 29/840 |

*Primary Examiner*—Olik Chaudhuri
*Assistant Examiner*—N Kelley
*Attorney, Agent, or Firm*—Robert D. Atkins

[57] ABSTRACT

An integrated circuit die is tested by inserting test probe needles into flat solder pads before reflow. The testing is performed at different temperatures to functionally test the integrated circuit die. The solder pads are flat during probe test to improve the uniform contact point and pressure for the test probes, and help avoid slippage or sliding. The probe needles may cause indentation in the solder pads. Following probe test, the solder pads are reflowed to transform the solder pads into solder bumps. Reflow after probe test removes any indentations from the solder pads created during the probe test and leaves only rounded solder bumps without probe damage. The solder bumps are used to flip-chip interconnect the IC into end user systems.

16 Claims, 1 Drawing Sheet

METHOD OF REFLOWING SOLDER BUMPS AFTER PROBE TEST

BACKGROUND OF THE INVENTION

The present invention relates in general to integrated circuit testing and, more particularly, to reflowing solder pads on an integrated circuit die following probe test.

In the prior art during manufacturing, solder pads are disposed on the integrated circuit (IC) die and reflowed into solder bumps shaped as a half hemisphere. The solder bumps are used to flip-chip interconnect the IC die into end user systems. The flip-chip interconnect technique saves having to use conventional plastic dual in-line or surface mount packages which are much larger than the IC die. The solder bumps perform a similar function as wire bonding in conventional IC packaging to electrically interconnect the IC die to the outside world. The flip-chip die is placed facing the printed circuit board and the solder bumps are reflowed to ensure conductivity to the interconnect channels on the printed circuit board.

During the manufacturing process, a functional test of the IC die typically occurs before final inspection and shipping. In the prior art, testing is performed after the reflow process. A test set inserts a plurality of probe needles into the solder bumps to perform an electrical functional test of the integrated circuit die prior to final inspection and assembly. The testing is often performed at multiple temperatures, e.g. 150° C. and −40° C., to test the integrated circuit die over a full range of operating conditions. Thus, the solder bumps may be pierced a number of times during the testing procedure. The solder bumps become gouged when the test probes are inserted into heated solder bumps. Alternately, a sliding defect can occur when the test probes slide off cold solder bumps.

Another problem occurs from variability in probe contact to the solder bumps during electrical testing. It is difficult to consistently contact the test probes to all the solder bumps simultaneously because of variations in their rounded shape. Consequently good devices may be rejected as failures. In addition to erroneous electrical test yield losses, there are valid inspection yield losses associated with visual rejects if the solder bumps have excessive damage due to probe testing.

Hence, a need exists to functionally test the IC die without damaging the solder bumps.

DETAILED DESCRIPTION OF THE PREFERRED EMBODIMENT

Figure 1:
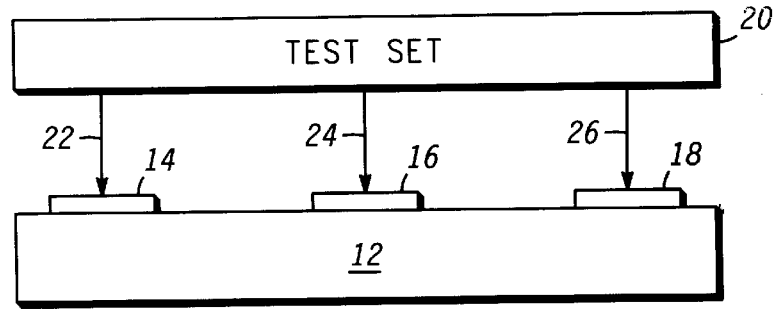
FIG. 1 illustrates probe testing of the integrated circuit die.
Figure 2:
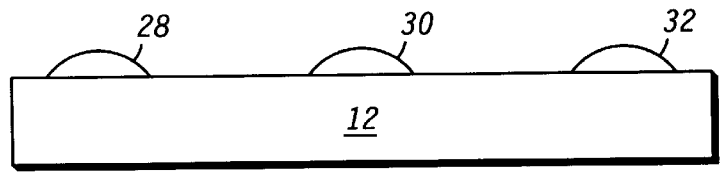
FIG. 2 illustrates the integrated circuit die after reflow processing.

Referring to FIG. 1, semiconductor integrated circuit (IC) die 12 includes flat solder contact pads 14, 16 and 18 disposed on its surface using conventional integrated circuit processes. During manufacturing, solder pads 14–18 disposed on IC die 12 are reflowed into solder bumps 28, 30, 32 shaped as a half hemisphere as shown in FIG. 2. The solder bumps 28–32 are used to flip-chip interconnect IC die 12 into end user systems. The flip-chip interconnect technique saves having to use conventional plastic dual in-line or surface mount packages which are much larger than IC die 12. Solder bumps 28–32 perform a similar function as wire bonding in conventional IC packaging to interconnect the IC die to the outside world. IC die 12 is placed face down on the printed circuit board and the solder bumps are reflowed to ensure conductivity to the interconnect channels on the printed circuit board.

In FIG. 1, test set 20 includes electrical test probes 22, 24 and 26 with appropriate displacement between the robes to line up with solder pads 14–18. Test probes 22–26 have sharp points which are forced against solder pads 14–18 respectively to make electrical contact necessary to functionally test IC die 12. At the point of electrical test, solder pads 14–18 are flat as they have not yet been reflowed to make solder pumps 28–32. Keeping solder pad 22–26 flat during probe test improves the uniform contact point and pressure for test probes 22–26, and helps avoid slippage or sliding that may occur with contacting rounded surfaces. Thus, flat surfaces are easier to make consistent point contacts than rounded surfaces. The electrical test may create indentations in solder pads 22–26. However, the reflow process after test removes any indentation or defects caused by probe test.

Figure 3:
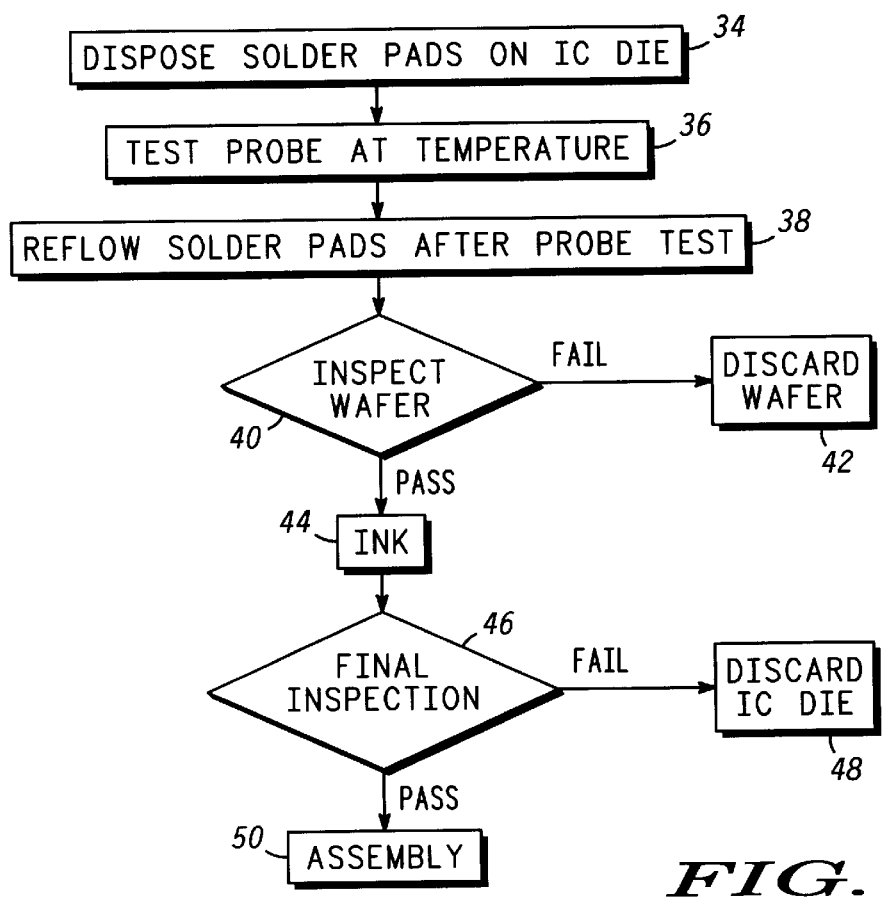
FIG. 3 is a flow chart illustrating the steps of probe testing and inspection.

Turning to flowchart shown in FIG. 3, step 34 defines the planar solder pads 14–18 for disposing on IC die 12. Solder pads 14–18 are probe tested at the desired temperature(s) in step 36. Temperature testing may involve testing at a first temperature at say 150° C. and then at a second temperature say −40° C. After probe testing, solder pads 14–18 are reflowed into half-hemisphere shaped solder bumps 28–32 by surface tension using conventional integrated circuit processes in step 38. The ICs devices in the wafer state are visually inspected in step 40 for bump height, width, and shear strength. Wafers failing inspection are discarded in step 42. Failed IC devices in good wafers are inked in step 44 to identify reject die. Final outgoing inspection occurs at step 46. IC devices failing final inspection are discarded in step 48. Good IC devices are shipped to end users for assembly in step 50.

IC die 12 shown in FIG. 2 is ready for shipment without indentations or test probe marks in solder bumps 28–32. IC die 12 has thus been fully electrically tested and inspected ready for use.

A key feature of the present invention is to do electrically probe testing before reflow while the metal contact pads 14–18 are still flat to allow a uniform probe pressure distribution to all test sites. The flat solder pads are far less sensitive to probe damage, especially when testing at multiple temperatures. Reflow after probe test produces uniform rounded solder bumps without probe damage. Yield is improved by both better contact at test and the elimination of probe damage to the solder bumps detected at final outgoing inspection. A statistically significant yield improvement may be observed by reflowing after probe compared to the conventional method.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of testing an integrated circuit die, comprising the steps of:

disposing flat solder pads on the integrated circuit die;

probing said flat solder pads to perform an electrical test on the integrated circuit die before a reflow solder process; and reflowing said flat solder pads following said probing step to transform said solder pads into rounded solder bumps.

2. The method of claim 1 wherein said probing step includes the step of inserting probe needles into said solder pads to make an electrical connection.

3. The method of claim 2 wherein said reflowing step removes any indentations from said solder pads created during said probing step.

4. The method of claim 3 further including the step of performing a first inspection of the integrated circuit die in wafer form following said reflow step.

5. The method of claim 4 further including the step of discarding the integrated circuit wafer upon failing said first inspection.

6. The method of claim 5 further including the step of inking the integrated circuit die upon passing said first wafer inspection.

7. The method of claim 6 further including the steps of:

performing a second inspection of the integrated circuit die following said inking step; and discarding the integrated circuit die upon failing said second inspection.

8. The method of claim 7 further including the step of performing final assembly of the integrated circuit die upon passing said second inspection.

9. A method of testing an integrated circuit die, comprising the steps of:

disposing flat solder pads on the integrated circuit die;

setting a first temperature condition for testing the integrated circuit die;

probing said flat solder pads to perform a first electrical test on the integrated circuit die under said first temperature condition before a reflow solder process;

setting a second temperature condition for testing the integrated circuit die;

probing said flat solder pads to perform a second electrical test on the integrated circuit die under said second temperature condition before said reflow solder process; and reflowing said flat solder pads following said probing steps for said first and second electrical tests to transform said solder pads into rounded solder bumps.

10. The method of claim 9 wherein said probing steps for said first and second electrical tests includes the step of inserting probe needles into said solder pads to make an electrical connection.

11. The method of claim 10 wherein said reflow step removes any indentations from said solder pads created during said probing steps.

12. The method of claim 11 further including the step of performing a first inspection of the integrated circuit die in wafer form following said reflow step.

13. The method of claim 12 further including the step of discarding the integrated circuit wafer upon failing said first inspection.

14. The method of claim 13 further including the step of inking the integrated circuit die upon passing said first wafer inspection.

15. The method of claim 14 further including the steps of:

performing a second inspection of the integrated circuit die following said inking step; and discarding the integrated circuit die upon failing said second inspection.

16. The method of claim 15 further including the step of performing final assembly of the integrated circuit die upon passing said second inspection.

* * * * *